United States Patent [19]

Burnham et al.

[11] 4,309,670
[45] Jan. 5, 1982

[54] TRANSVERSE LIGHT EMITTING ELECTROLUMINESCENT DEVICES

[75] Inventors: Robert D. Burnham, Los Altos Hills; Donald R. Scifres, Los Altos; William Streifer, Palo Alto, all of Calif.

[73] Assignee: Xerox Corporation, Stamford, Conn.

[21] Appl. No.: 75,381

[22] Filed: Sep. 13, 1979

[51] Int. Cl.³ .............................................. H01S 3/19
[52] U.S. Cl. .................................. 331/94.5 H; 357/17
[58] Field of Search .................... 331/94.5 H; 357/16, 357/17, 18

[56] References Cited

U.S. PATENT DOCUMENTS

| | | | |
|---|---|---|---|
| 3,936,855 | 2/1976 | Goell et al. | 357/17 |
| 4,010,483 | 3/1977 | Liu | 357/17 |
| 4,053,914 | 10/1977 | Goodwin | 357/17 |
| 4,081,763 | 3/1978 | Vlasenko et al. | 331/94.5 H |
| 4,212,021 | 2/1980 | Ono et al. | 357/17 |

OTHER PUBLICATIONS

Shimano et al., "Observation of Internal Interference in the Emission Spectrum of the Burrus Type GaAs-GaAlAs DH LED's with Thin Active Layer", *Japan J. Appl. Phys.*, vol. 17, No. 1, 1978, pp. 237-238.

Dyment et al., "Top and Side Emission from Double Heterostructure LED's and Laser's", *IEEE Trans. Electron Devices*, ED-24, No. 7, Jul. 1977, pp. 995-1000.

*Primary Examiner*—James W. Davie
*Attorney, Agent, or Firm*—W. Douglas Carothers, Jr.

[57] ABSTRACT

Improved lateral carrier and optical confinement is achieved in heterostructure diodes and lasers having a Fabry-Perot cavity transverse to the plane of the p-n junction of the device. Structural features during fabrication improve carrier confinement to the active region in the established optical cavity. Current confinement means is also fabricated above and below the active region to concentrate the current density to the active region in the optical cavity and thereby improve the overall gain of the device. Such confinement also enhances optical confinement along the cavity. Several reflector structures are disclosed for employment at the cavity ends to provide optical feedback.

21 Claims, 27 Drawing Figures

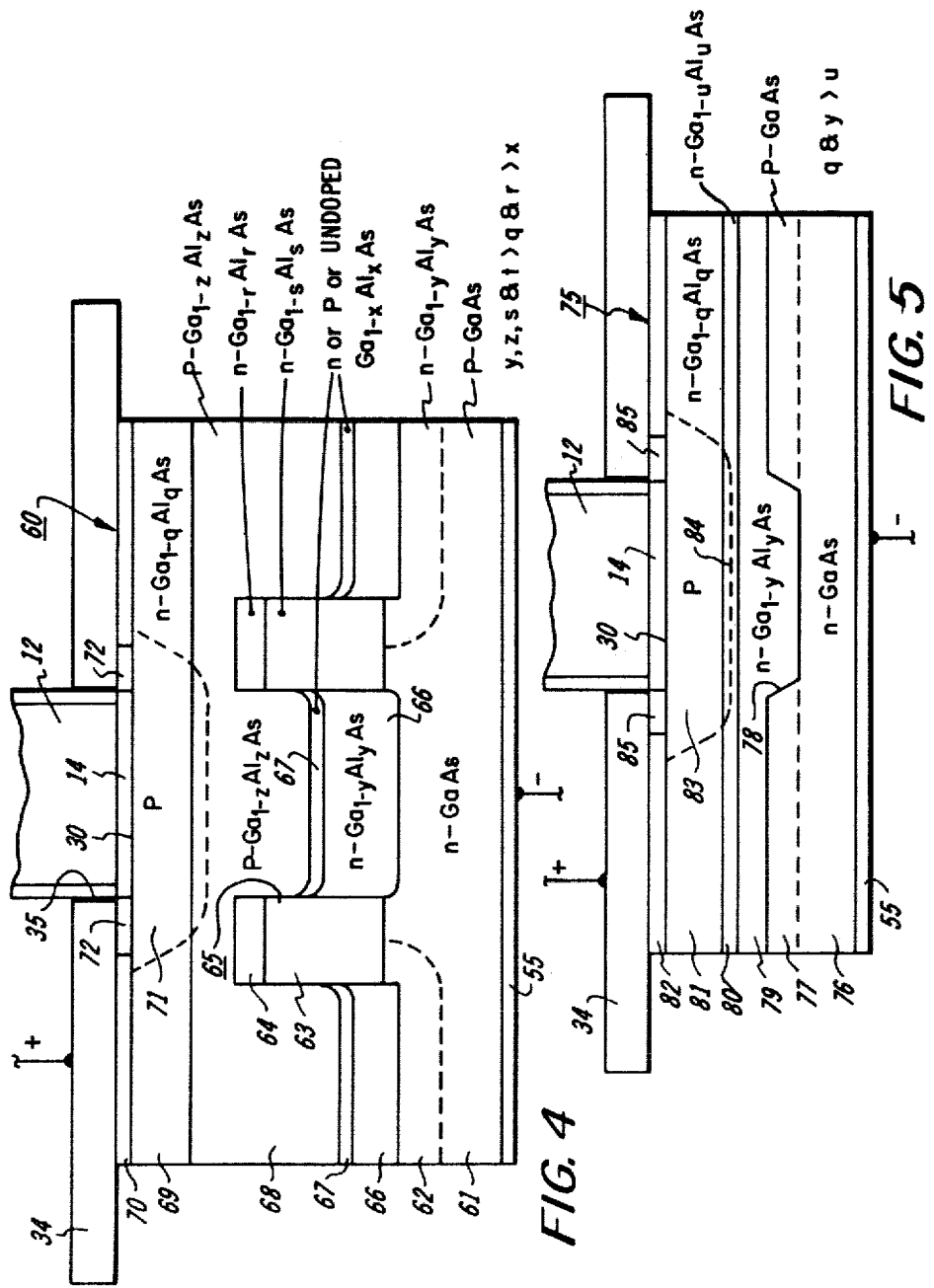

TRANSVERSE LIGHT EMITTING ELECTROLUMINESCENT DEVICES

BACKGROUND OF THE INVENTION

This invention relates to electroluminescent devices and more particularly to light emitting hetrostructure diodes and lasers that have a Fabry-Perot optical cavity transverse to the contiguous layers of the device.

A majority of the solid state laser devices known today emit light from the cleaved facets of the device along the p-n junction of the device. That is, the Fabry-Perot cavity is parallel to the contiguous layers of the device. It is desirable that these lasers emit light through the top or bottom of the device thereby eliminating the need to provide cleaved facets for optical feedback and permitting them to be integrated during their fabrication with other electro-optic components and elements. Symmetric output beams could be readily achievable and overall fabrication of these devices could be simplified. Furthermore, the area of the emitting cavity can be easily controlled to desired specifications and coupling to light transmissive mediums would be simpler as compared to cleaved Fabry-Perot coupling or end coupling.

Light emitting diodes have been designed to emit light normal to the junction plane of the device. These devices may be designed for coupling to a light transmission medium, such as, an optical fiber. Low coupling efficiencies, however, have been continuously experienced. Also, high current densities employed to obtain sufficient light coupling into the fiber for efficient optical communication have caused degradation and excessive heating of these devices. An example of such a device wherein there is disclosed a Burrus type of light emitting diode disclosed in U.S. Pat. No. 3,936,855. These particular types of structures lack rigidity in fiber connection and difficulty in fabrication in forming an etched well into and through the substrate of the device. Also, they lack good current and optical confinement in the lateral direction.

This is not to say that such transverse light emitting laser devices have not been suggested or known. U.S. Pat. No. 4,081,763 discloses a solid state laser of ZnS material wherein a Fabry-Perot type cavity is formed perpendicular to the plane of the contiguous layers of the device. Feedback is provided by mirrors in the cavity. A very large intense electric field is required in order for the device to be operative.

Another example is the publication, "Observation of Internal Interference in the Emission Spectrum of the Burrus Type GaAs-GaAlAs DH LED's with Thin Active Layer," Shimano et al, Japan Journal of Applied Physics, Vol. 17, No. 1, pp. 237–238 (1978). Disclosed in this publication is an LED having transverse light emission from the top of the device. Laser action is suggested to be possible if mirror surfaces are provided at the ends of the optical cavity, although the device disclosed was not capable of lasing.

A closer look at these two disclosures reveals the difficulties encountered in establishing good current and optical confinement. Carrier confinement along the Fabry-Perot cavity is not good, providing for high current thresholds. Carriers diffuse into regions adjacent to the cavity. Without good lateral confinement, quantum efficiencies are low. Also these devices provide no means by which improved optical confinement to the Fabry-Perot cavity might be achieved. As noted, light emission is relatively angular relative to the plane of the emission window of the device.

SUMMARY OF THE INVENTION

In accordance with the present invention, improved carrier, current and optical confinement is obtained in transverse light emissive heterostructure diodes and lasers thereby improving their quantum efficiencies.

This is achieved by providing structural means in heterostructure diodes and lasers that provide for improved lateral carrier confinement and improved optical confinement to the Fabry-Perot cavity which is transverse to the deposited layers comprising the diode or laser device. Current confinement means may be fabricated above and below the active region of the device to concentrate the current density to the active region of the device and also improve the gain in the device. By the same token, lateral carrier diffusion into regions outside the optical cavity is reduced.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 4 is a side view of still another heterostructure diode having improved current confinement means.

FIG. 5 is still a further heterostructure diode having improved current confinement means.

DESCRIPTION OF THE PREFERRED EMBODIMENTS

Introduction

Because of the number of structures to be discussed, numeral references to the drawings will be minimized by employing the same numeral for like components or elements in different structures. A different numeral is employed where compositional or geometrical changes are made to such a component or element. Structural components, once numerically identified and described, will not be described again unless there is an intended modification thereto.

The structure shown are not necessarily limited to any particular process of fabrication. Liquid phase epitaxy (LPE) or vapor phase epitaxy (VPE), such as, molecular beam epitaxy (MBE) metalorganic chemical vapor deposition (MOCVD) may be employed. Preferred processing is mentioned relative to particular structures to be disclosed.

Also, different alloy compositional materials and systems may be employed. For example, InP substrates may be employed, which can be lattice matched to $In_{1-x}GA_xAs_{1-y}P$ deposited layers.

Also, the conductivity type of the layers of the structures to be described may be reversed, as is well known in the art.

The light emitting regions from the diode and laser structures are geometrically described as circular. However, the geometry can be of any desired shape, such as square, oval, rectilinear, triangular, or any irregular shape, by employing conventional techniques, e.g., oxide masking, ion or proton implantment, selective etching, selective diffusion and selective epitaxy.

LIGHT EMITTING DIODE STRUCTURES

Figure 1:
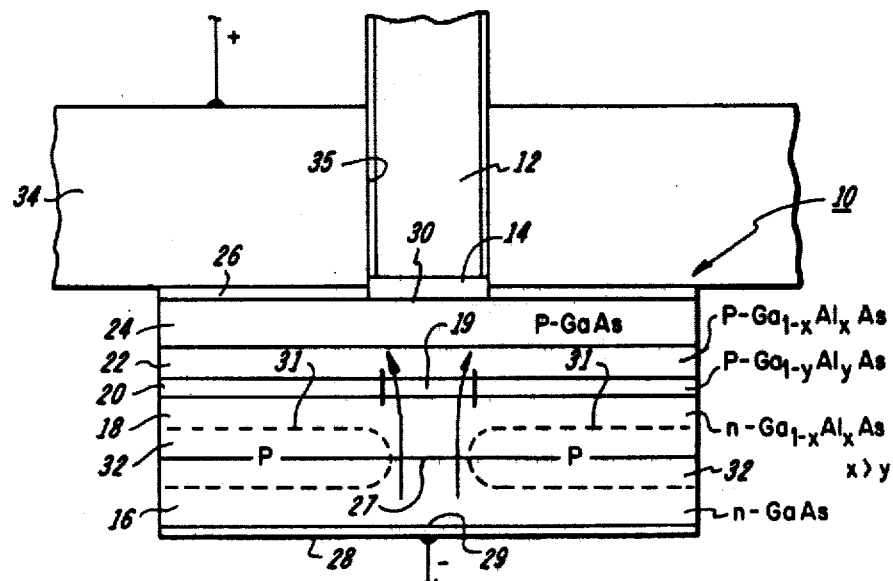
FIG. 1 shows a side view of heterostructure diode having improved current confinement means.

In FIG. 1, the heterostructure diode 10 is shown coupled to an optical fiber 12 by means of epoxy at 14. Diode 10 comprises a n-type GaAs substrate 16 upon which may be epitaxially grown layers 18, 20, 22, and 24, respectively of $n-Ga_{1-x}Al_xAs$, $p-Ga_{1-y}Al_yAs$ (active layer), $p-Ga_{1-x}Al_xAs$, and p-GaAs. Metalization is provided at 26 and 28 with an opening 30 provided in metalization 26 for coupling of fiber 12. The diode 10 is mounted on a header 34 by suitable means, such as, indium or tin solder. Layers 18 and 20 form a p-n junction and provide a major light emitting region at 19. Current flow to region 19 is confined by means of the selectively diffused p-type region 32. Region 32 is provided on the surface of substrate 16 by zinc doffusion prior to layer growth. Circular masking on the surface of substrate 16 prevents diffusion in channel 27. Upon subsequent layer growth, and in particular, layer 18, back diffusion occurs creating an annulus type diffused region 32 forming a current channel 27. Upon forward biasing of diode 10, current will be confined through channel 27 because of the reversed bias junction 31 formed by region 32, concentrating photon and carrier confinement to region 19 of the active layer 20. This helps to keep carriers from diffusing laterally away from region 19. Metalization in region 29 of metalization layer 28 provides a mirror surface for reflection of light along an optical path through channel 27 to provide greater light output to fiber 12.

In diode 10, layer 18 may be 1 μm thick, active layer may be 0.1 to 2 μm thick, layers 22 may be 1 μm thick and layer 24 may be 1.5 μm thick.

The advantage of structure of diode 10 over the Burrus type diode is the ease of assembly to a metal header 34. The diode 10 is mounted p side down onto the heater 34. Also header 34 provides for fiber alignment through an opening 35. The substrate etching step employed for coupling the Burrus type diode to a light fiber is eliminated. An etching well must be fabricated through the Burrus substrate structure after which the diode is epoxy mounted to the fiber end. It is difficult to control the depth of such a selective etching process. The epoxy mounting does not provide a strong coupling nor is there efficient heat sinking, as compared to diode 10.

Figure 2:
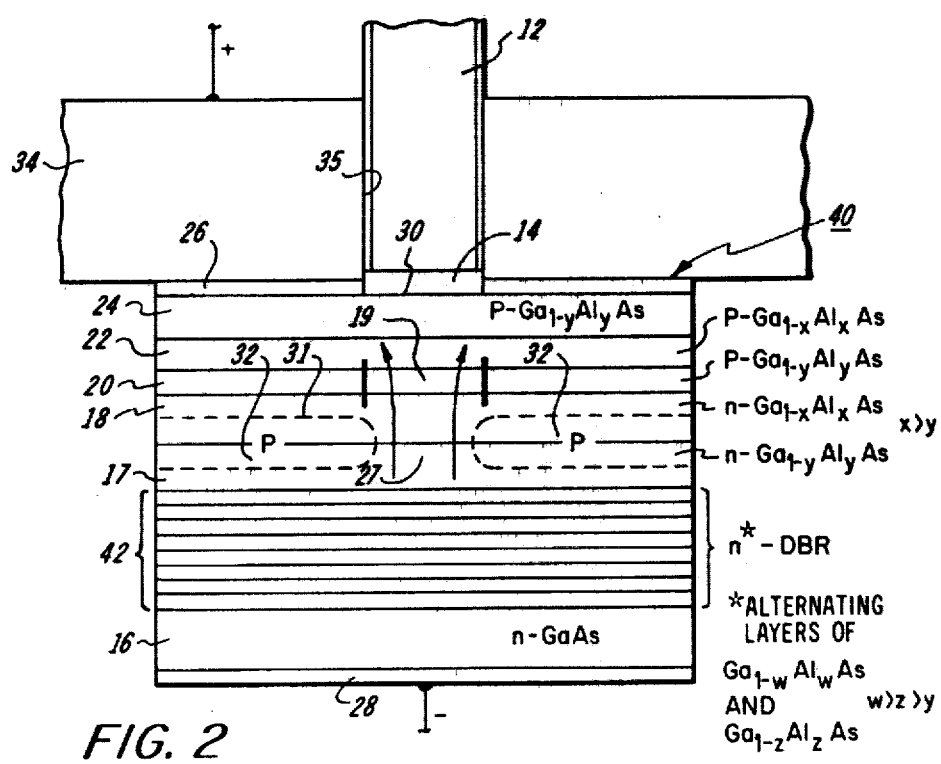
FIG. 2 is a side view of heterostructure diode similar to FIG. 1 and having a DBR component.

The diode 40 shown in FIG. 2 is quite similar to the structure of diode 10. However, a layer 17 of $n-Ga_{1-y}Al_yAs$ and a distributed Bragg reflector (DBR) 42 are provided between substrate 16 and layer 18. DBR 42 comprises alternating layers of n-type $Ga_{1-w}Al_wAs$ and $Ga_{1-z}Al_zAs$ where w is greater than z. Improved reflectively is obtained with the DBR 42 so that more light will be coupled into the fiber 12. Diffused region 32 is preferentially formed in layer 17 during growth and back diffusion into layer 18 occurs during subsequent crystal growth to form the p-n junction 31.

An n-type selective diffusion may be performed through the layer 24 in regions thereof not directly above active region 19. The junction formed would confine the current path into the header 34 in areas adjacent to the fiber 12.

In diodes 10 and 40, selective diffusion provides for a circular current channel 27 within the device for current confinement and coupling of light out of the top of the device.

Figure 2A:
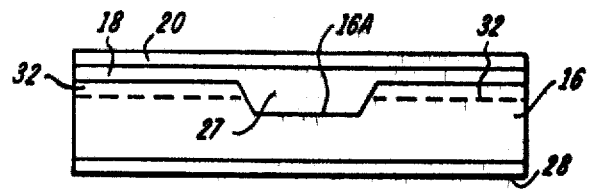
FIGS. 2a and 2b show supplement designs that may be employed in the substrates of the diodes of FIGS. 1 and 2.

In FIG. 2a, an alternative current confinement means would be a circular cavity 16A etched into the upper surface of the substrate 16. A selective zinc diffusion 32 is first performed into the surface of the substrate 16 to provide a current barrier junction. Current would be confined through the circular cavity 16A in the substrate. Subsequent LPE or MOCVD growth of layer 18 on the surface substrate 12 would be extended until layer 18 becomes smooth and flat. Then active layer 20 would be deposited.

Figure 2B:
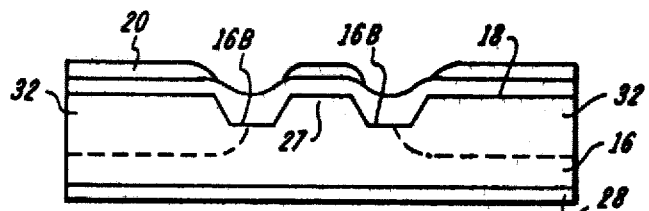

As a further alternative, an etched annulus 16B, shown in FIG. 2b, may be performed in the substrate to form a current channel. A selective zinc diffusion 32 may be first performed on the surface of the substrate 16 prior to the formation of this annulus configuration.

Figure 3:
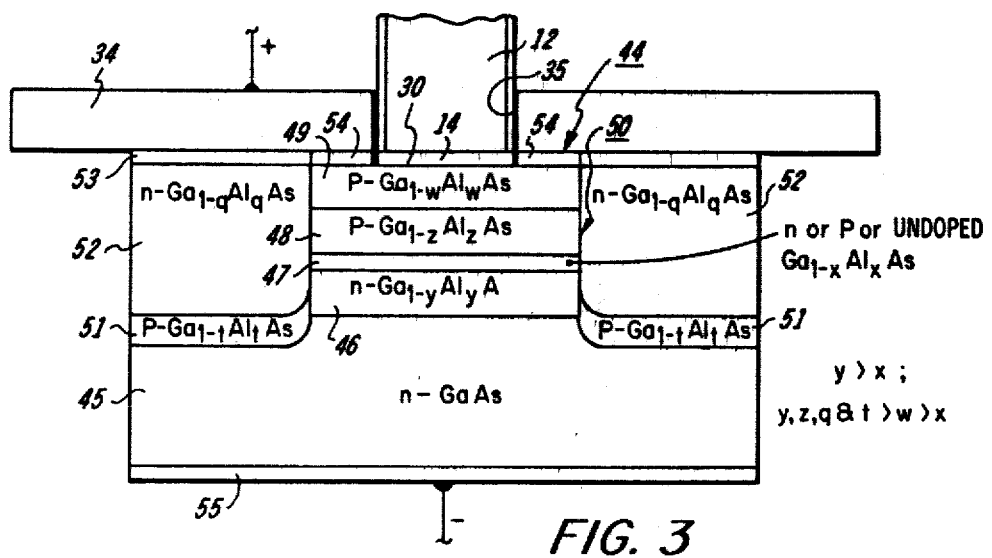
FIG. 3 is a side view of another heterostructure diode having improved current confinement means.

The diode structures in FIGS. 3, 4 and 5 provided for even further carrier confinement. The structures confine carriers to the thin active region which comprises a small plane area, for example, less than 75 μm in diameter, which is a conventional optical fiber diameter. The important additional feature of these structures is complete current confinement to a small volume active region which is subjected to high current densities.

FIGS. 3 and 4 show structures in which the circular active region is totally surrounded by barrier means of a wider bandgap material providing efficient radiative recombination in the active region. FIG. 5 shows a structure in which the circular active region is formed by selective diffusion providing efficient radiative recombination in the active region.

In FIG. 3, the diode 44 comprises a n-GaAs substrate 45 upon which are consecutively grown layers 46, 47, 48 and 49, respectively, n-$Ga_{1-y}Al_yAs$, n or p undoped $Ga_{1-x}Al_xAs$ (active layer), p-$Ga_{1-z}Al_zAs$ and P-$Ga_{1-w}Al_wAs$ wherein y, z is greater than w, which is greater than x. These layers are grown across the entire width of the device. Layer 49 provides good electrical contact between the header 34 and the diode device.

The method of this growth is preferrably LPE or MOCVD. After the first stage growth, a circular mesa 50 is formed by etching away the remaining structure, the etching performed into the substrate 45. Second stage growth is initiated, with the consecutive deposition of annulus shaped layers 51 and 52. During the second stage growth, the top surface of mesa 50 is masked to prevent growth on the mesa 50. This second stage of growth is best suited by MBE. The layers 51 and 52 are, respectively, $Ga_{1-t}Al_tAs$ and $Ga_{1-q}Al_qAs$, where q and t are greater than x so that layers 51 and 52 form materials of wider bandgap than active layer 47.

The diode 44 is capped with a silicon nitride layer 53. A central opening 30 is etched into this layer within which the fiber 12 is attached to the structure by means of epoxy 14. The metalization 54 provides for electrical connection to the header 34.

Diode 60 in FIG. 4 is fabricated with a second growth active region as compared to diode 44 of FIG. 3, which contains a first growth active region. Starting with substrate 61, an annulus diffusion region 62 is formed in the substrate. This is followed by the growth of layers 63 and 64 across the entire width of the device. Layers 63 and 64 are, respectively, n-$Ga_{1-s}Al_sAs$ and n-$Ga_{1-r}Al_rAs$. Layer 64 has very little aluminum content compared to all the other aluminum containing layers of this diode device except for active layer 67. Layer 64 provides a means for proper growth during second stage growth.

The annulus shape of these two layers 63 and 64 is formed by selective etching via annulus masking, forming the circular channel 65.

Second growth comprises consecutive deposition of layers 66, 67, 68 and 69 which, respectively, comprise n-$Ga_{1-y}Al_yAs$, n or p undoped $Ga_{1-x}Al_xAs$ (the active layer), p-$Ga_{1-z}Al_zAs$ and n-$Ga_{1-q}Al_qAs$ wherein y, z, s and t are greater than q and r, which are greater than x.

A silicon nitride layer 70 is deposited upon layer 69. Masking during this deposition provides a central opening through which a zinc diffusion is performed, forming a diffused region 71. As in the case of diode 44, the fiber 12 is secured to the diode device by epoxy 14 and metalization 72 provides electrical contact with the header 34 for current access to the diode 60.

Diode 60 provides for good carrier confinement by means of the n-type $Ga_{1-s}Al_sAs$ barrier 63 and good current confinement by means of the diffused p-type regions 62 and 71.

The diode 75 in FIG. 5 comprises a n-GaAs substrate 76 upon which is consecutively deposited layers 79, 80, and 81, which are, respectively, n-$Ga_{1-y}Al_yAs$, n-$Ga_{1-u}Al_uAs$ and n-$Ga_{1-q}Al_qAs$. This structure is capped with a silicon nitride layer 82. Layer 82 is masked during deposition to provide the circular opening 30.

Prior to the growth of these layers, a zinc diffusion 77 is formed into the surface of the substrate 12 followed by the etched formation of the circular shaped channel 78. A zinc diffusion is performed through the opening 30 establishing a p-type region 83 and the p-n junction 84 in the active layer 80. Metalization 85 is deposited in the nitride opening after the attachment of a fiber 12 to the diode 75 by means of epoxy 14.

Current confinement is provided by the diffused regions 77 and 83. The applied current is directed through the metalization 85, across the junction 84 and thence through the channel 78.

The respective active regions 47, 67 and 84 of diodes 44, 60 and 75 are fabricated as thin as possible to provide for higher quantum efficiencies. Lateral confinement of carriers at the respective p-n junctions in the active regions of these devices is provided by the diffusion regions in diodes 60 and 75 and the compositional barriers in diodes 44 and 60 performed, respectively, by layer 52 and layer 63. With this lateral confinement, the quantum efficiency of the device is increased and determines, to some extent, the amount of light that will reach the fiber 12, since these compositional barriers will provide some optical confinement.

An example of the molar fractions for diodes 44, 60, and 75 would be x=0 to 0.05, y=0.3, z=0.3 and q and t may be equal to 0.3. The value for w may be 0.1, as long as its value is greater than x.

DIODE LASER STRUCTURES

The structure of the foregoing diodes can be further modified to provide a Fabry-Perot cavity in direction perpendicular to the p-n junction. Lasing conditions can be established if carrier and optical confinement are provided along the established cavity and mirror structures are provided in the end surfaces of the established cavity.

Figure 6:
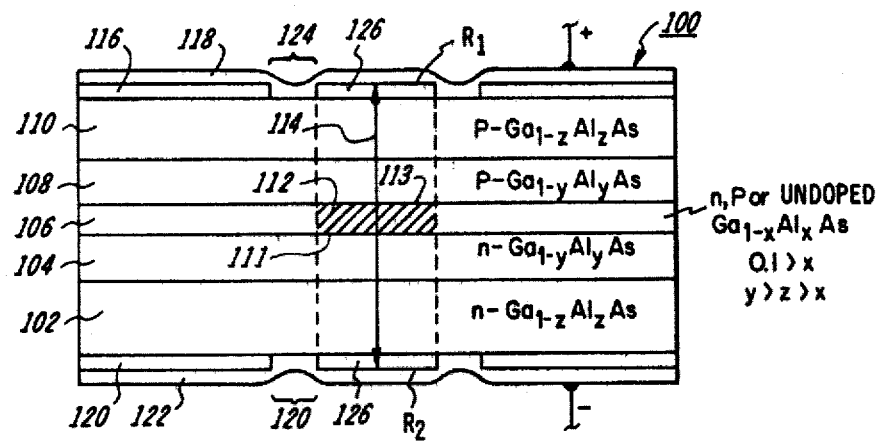
FIGS. 6, 6a, and 6b show side views of heterostructure lasers for explanation of optical feedback and current confinement properties.

In FIG. 6, an idealized transverse light emitting laser 100 is shown. Laser 100 comprises sequentially grown layers 102, 104, 106, 108 and 110 which are, respectively, n-$Ga_{1-z}Al_zAs$, n-$Ga_{1-y}Al_yAs$, n, p or undoped $Ga_{1-x}Al_xAs$, p-$Ga_{1-y}Al_yAs$ and p-$Ga_{1-z}Al_zAs$. Bottom layer 102 may be either GaAlAs, as shown, or may be GaAs. The active region is shown crosshatched at 112 in layer 106. The optical cavity is represented by the double headed arrow 114 and the dotted lines substantially represent the outer limits of the cylindrically shaped optical cavity.

An example of molar fractions for layers 102–110 are x less than 0.1, y=0.3 to 0.5 and z=0.1. Layers 104 and 108 may be 1 to 2 μm thick. Active layer 106 may be from 0.1 to 10 μm thick. The optical cavity 114 is approximately 15 μm in diameter.

Reflectors $R_1$ and $R_2$ are the metalization layers 118 and 122 at the ends of the optical cavity 114. The silicon nitride layers 116 and 120 are deposited, masked and etched to define an annulus stripe region 124 and provide the circular islands 126 of nitride. The thickness of the nitride islands or pads 126 is designed to be antireflective at the fundamental wavelength of the laser 100.

With current confinement to the two small donut stripe shapes 124 in areas of the device between metalization layers 118 and 122, the necessary gain can be achieved with sufficient current density, i.e., gain is proportional to current density, $J^m$, where m is equal to or greater than 1 and is equal to or less than 3.5, depending on the doping of the active layer 106.

The current confinement stripes geometry may be square or oval shaped rather than annulus shaped. Conventional technologies are employed to apply the desired stripe pattern, such as oxide masking, ion or proton implantation, selective etching, selective diffusion and selective epitaxy. More specific reference will be made to some of these techniques relative to the description of subsequent embodiments.

The circular nitride pads 126 must be of appropriate thickness to match the wavelength of the optical wave established in the cavity.

Since the Fabry-Perot cavity 114 is from top to bottom in laser 100, the active region 112 is very short compared to the total length of the laser cavity. In fabricating the laser, it is important to make the optical path as transparent as possible to the light generated in the active region 112 and, thus, layers 102, 104, 108 and 110 all consist of GaAlAs having a wider bandgap than layer 106, i.e., y and z are greater than 0.1 and x is less than 0.1. This is best achieved by crystal growth employing MOCVD.

Since the overall gain for this type of otpical cavity 114 is low due to the short length of the active region 112, it is important to maintain the laser from lasing along the p-n junction plane, which plane may be at 111 or 113 depending on the doping of layer 106, and the success achieved in current confinement according to the previously mentioned gain-current density relationship. Alleviation of the high gain requirements can be further improved by increasing the reflectivity of the mirrors $R_1$ and $R_2$. Reflectivity greater than 90% can be achieved by using a metal reflector on the surface of the nitride pad 126. The metal employed may be vapor deposited gold, silver or aluminum. This will ensure uniform pumping of the active region 112.

Figure 6A:
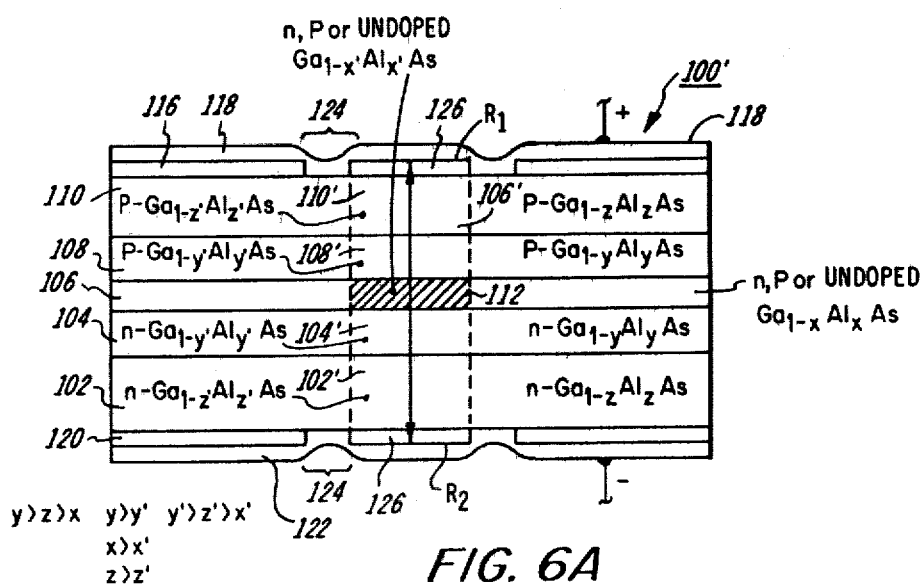

The idealized structure of laser 100' in FIG. 6a is primarily the same as that shown in FIG. 6, except that the regions 102', 104', 106' (active region 112), 108' and 110' of layers 102, 104, 106, 108, and 110 have a lower aluminum concentration than adjacent regions of the same layers, thereby providing these regions 102'–110' with a lower bandgap than their corresponding adjacent regions of the same layers. This provides for improved optical and carrier confinement within the optical cavity 114.

A method of fabrication of laser 100' would be MBE wherein masks are employed in the MBE chamber to provide proportionally different (larger) aluminum molar fractions for regions of layers 102–110 outside the optical cavity than for regions 102'–110'. Also, an additional gallium source may be used in the MBE chamber to supply additional gallium atoms in regions 102'–110'. About 1% or less gallium is added in these center regions with a focussed gallium beam.

Figure 6B:
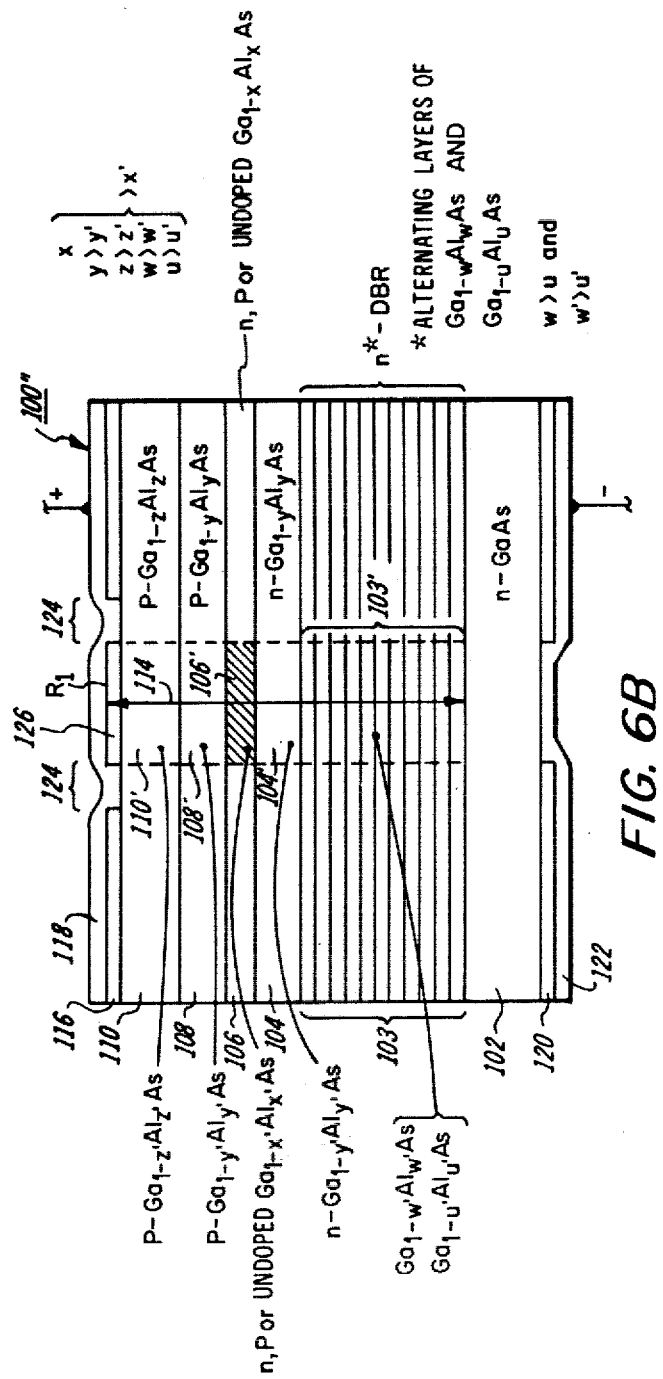

Laser 100'' in FIG. 6b is essentially the same as laser 100' in FIG. 6a, except that it includes a distributed Bragg reflector (DBR) 103 between layers 102 and 104. Laser 100'' may be fabricated in the same manner as the laser 100'. DBR 103 comprises alternating n doped layers of $Ga_{1-w}Al_wAs$ and $Ga_{1-u}Al_uAs$ wherein w is greater than u. In region 103' of these alternating layers 103, the relationship is w' greater than u', with w greater than w' and u greater than u'. The use of the DBR 103 provides a periodic grating effect in the optical cavity 114 causing light in the cavity to be reflected back to the active region 112 toward mirror $R_1$. The second mirror $R_2$ is, therefore, not needed. Layer 102 may be GaAs rather than GaAlAs since most of the light is reflected into the optical cavity 114 at the DBR 103'.

Because the aluminum content in the regions 103–110' is slightly lower than in these same layers in adjacent regions, i.e., $$\left.\begin{array}{c} x \\ y > y' \\ z > z' \\ w > w' \\ u > u' \end{array}\right\} > x',$$

carrier and optical confinement can be obtained in the active region 112 with sufficient gain to achieve lasing in the device.

The molar fractions for laser 100'' may be x'=0.05, x=0.3, y=0.5, y'=0.3, z=0.15, z'=0.1 (z'>x'), w=0.7, w'=0.5, u=0.3 and u'=0.1.

The DBR 103 may be doped n type or p type, depending on the location of the DBR in the laser structure. The thickness of the alternating layers depends on the wavelength of lasing light. In general, the thickness of each layer should be ½ wavelength or ¼ wavelength of the lightwave wavelength. For a GaAlAs laser this is approximately 1000 A to 3000 A for each layer.

The DBR 103 may also be employed between layers 102 and 104 in the laser 100. Also a DBR with the same fabrication as the DBR 103, except of p-type conductivity, may be employed between layers 108 and 110 of laser 100 and laser 100'', eliminating the need for both mirrors $R_1$ and $R_2$ in these structures.

Figure 7:
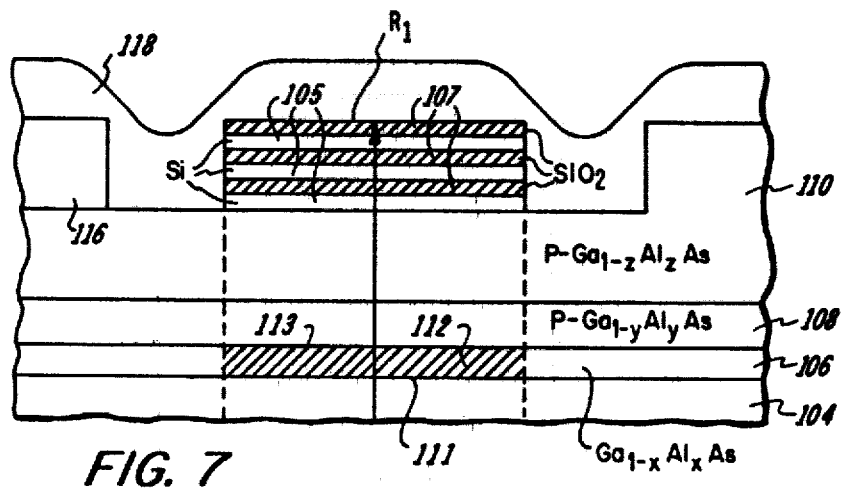
FIG. 7 is an enlarged detail of a mirror structure that may be employed in the laser structures of this invention.

Mirrors $R_1$ and $R_2$ may be a nitride, such as, $Si_3N_4$ or a conductive oxide, such as, $SnO_2$ or $In_2O_3$. In the case of a nitride, the mirror is provided by the metalization itself or by vapor deposition of a mirror surface of gold, silver or aluminum, as previously indicated. The mirrors $R_1$ and $R_2$ may alternatively consist of a dielectric stack, as shown in FIG. 7. The stacked dielectric materials, formed by sequential epitaxial deposition, may comprise alternating dielectric layers 105 and 107 of silicon and silicon dioxide or $Al_2O_3$, i.e., alternating dielectric layers of low and high refractive index. The thickness and the period of the layers 105 and 107 depends upon the wavelength of the lasing light. This relationship of thickness to wavelength can be mathematically calculated in a conventionally known manner.

Figure 8:
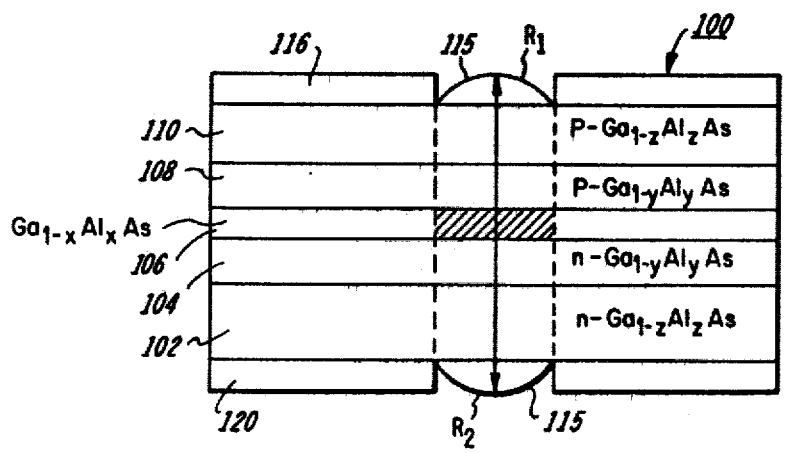
FIG. 8 is a side elevation of a laser of this invention having a modified mirror structure.

FIG. 8 shows an example of employing electrically conductive tin oxide, $SnO_2$ for mirrors $R_1$ and $R_2$. The mirror surfaces may be planar or they may be parabolic, as shown at 115 in FIG. 8. The parabolic surface or curvature causes light in the optical cavity 114 to be reflected and focused back into the cavity toward the oppositely opposed mirror. The conductive $SnO_2$ mirrors are applied to the surfaces of the laser 100 by selective evaporation. The electrodes for current operation of the laser may be soldered directly to the parabolic surface 115.

The carrier confinement, carrier density, active region thickness and mirror reflectivity and gain of these idealized transverse emitting structures may be improved by various structural features to eliminate, or otherwise reduce, to a great degree, lateral current spreading and improve optical wave confinement and guiding. These structural features are detailed in the remaining figures to be described.

Figure 9:
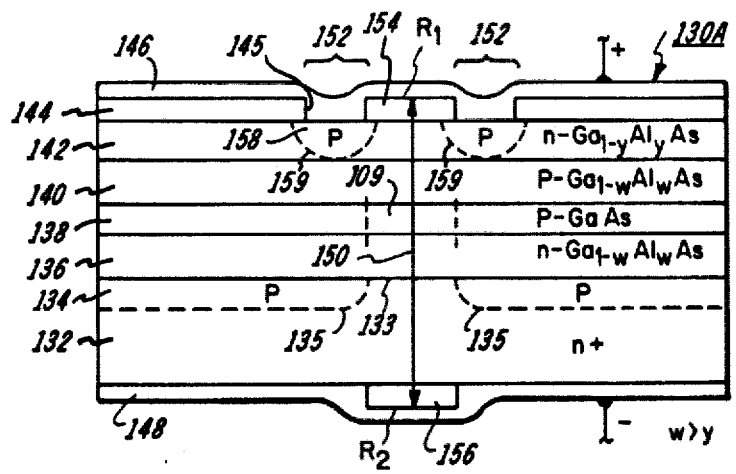
FIG. 9 is a side view of a laser comprising this invention having current confinement structure in the upper and lower most layers of the laser.

In FIG. 9, laser 130a comprises a n-type substrate 132 which may be either GaAs or GaAlAs. The use of GaAlAs is preferred since GaAs may be too absorbent to light. Aluminum in the substrate reduces such absorbtion.

A selective zinc diffusion is performed on substrate 132 to form an annulus type diffused p type region 134. This diffusion leaves a circular surface area 133 in the center of the n type substrate surface. A $Si_3N_4$ diffusion mask having the diametrical size of circular region 133 may be applied to the substrate surface prior to the selective zinc diffusion of the substrate 132. Layers 136, 138, 140, 142 are then consecutively, grown on substrate 132 by LPE or VPE (MBE or MOCVD, etc.), preferably by VPE because of the flexibility in controlling the growth of the consecutive layers. Layers 136, 138, 140 and 142 are, respectively, n-$Ga_{1-w}Al_wAs$, p-GaAs (the active layer), p-$Ga_{1-w}Al_wAs$ and n or p $Ga_{1-y}Al_yAs$. In the FIG. 9 embodiment, layer 142 is n doped, while in the FIG. 10 embodiment, this layer is p doped. In the epitaxial growth of these layers, some back p-type diffusion may occur from region 134 into layer 136 as disclosed in U.S. Pat. No. 3,984,262. This is an inherent phenomena and is desirable.

Layer 142 is capped by a silicon nitride layer 144. With selective etching, after deposition of layer 144, or selective masking prior to deposition of layer 144, a circular channel 145 is formed in the nitride layer leaving an island 154 of nitride. Island or pad 154 is in alignment with the circular n-type configuration 133 in substrate 132. A nitride island 156 may be formed by selective masking and vapor deposition and fabricated to be in alignment with the island 154.

A zinc doped skin diffusion 159 is then performed through the circular channel 145 to the layer 142. This forms an annulus type p region 158. Next, metalization layers 146 and 148 are deposited, as shown, by conventional vapor deposition techniques. The metalization layer 146 forms an annulus current confinement stripe 152. The areas of metalization over the nitride islands 154 and 156 form mirrors $R_1$ and $R_2$.

Carrier confinement is provided on both sides of active region 109 of the laser 130a by means of the p type diffused regions 134 and 158. These regions provide p-n junctions 135 and 159 that are back biased during current pumping of the laser thereby aiding in confinement of the carriers to the active region 109. These lateral barriers help prevent lateral carrier diffusion and help confine optical wave propagation to the established Fabry-Perot cavity 150.

Figure 10:
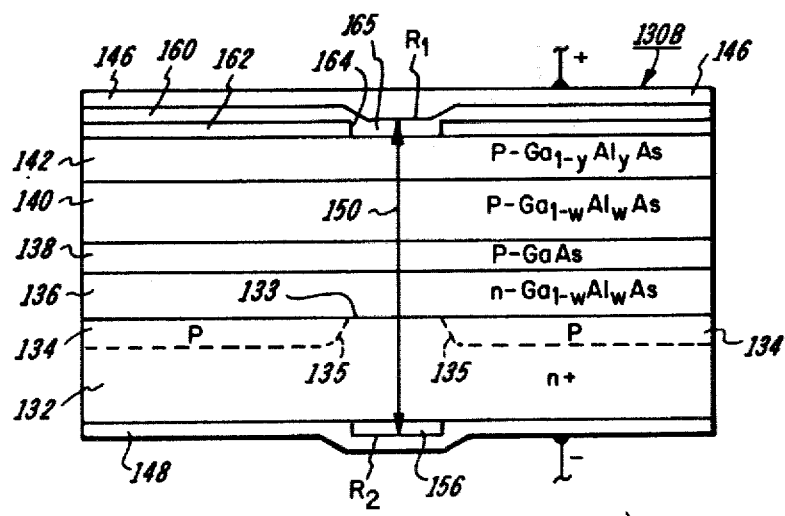
FIG. 10 is a side view of a laser comprising this invention similar to that of FIG. 9 but employing a different upper mirror structure.

The laser 130b of FIG. 10 is fabricated in the same manner as laser 130a, except that the mirror $R_1$ construction is different. Mirror $R_1$ comprises a conductive oxide layer 160, such as, $SnO_2$ or $In_2O_3$, vapor deposited on a nitride layer 162. Layer 162 is provided with a central opening 164 by means of selective etching prior to vapor deposition of the oxide layer 160. The conductive oxide layer 160 is transparent to the light so that the metalization 146 provides a mirror surface at the oxide-metal interface to produce mirror $R_1$. This structure also functions as a circular current confinement contact pad 165 within opening 164.

In laser 130b, the capping layer 142 is p type GaAlAs and, therefore, no p-type diffused region 158 is necessary.

Figure 11:
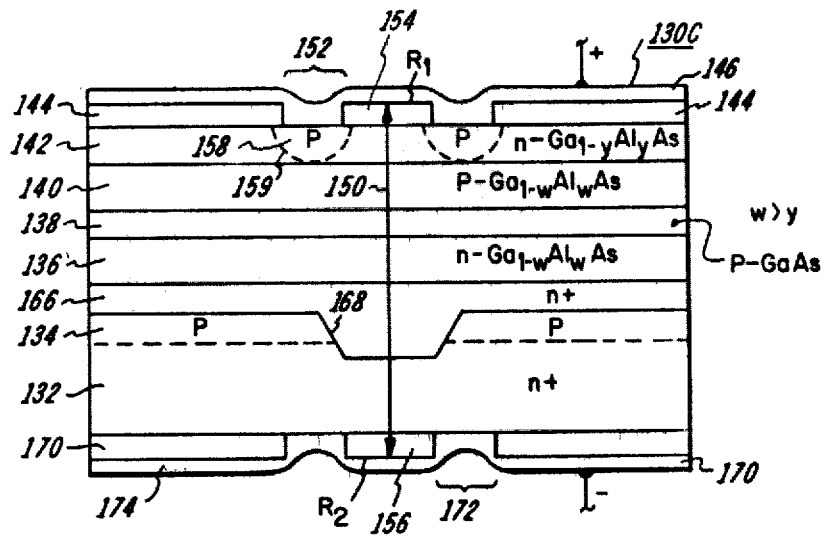
FIG. 11 is a side view of a laser comprising this invention similar to that of FIG. 9 but employing a different lower mirror structure.

The laser 130c in FIG. 11 is similar to laser 130a in FIG. 9, except for the fabrication of the substrate 132 and the provision of the annulus current confinement stripe 152 and 172 on the bottom of as well as the top of the laser structure. Further, there is included an additional n type layer 166 in the structure. Layer 166 will be the same as the substrate material (GaAs or GaAlAs) and reduces refraction of light propagating between layers 132 and 166.

Substrate 132 of n type conductively is first selective zinc diffused to provide a p type diffused region 134. Next, a circular channel 168 is etched into the substrate. Layers 166, 136, 138, 140, and 142 are then sequentially grown by conventional epitaxial methods.

The bottom surface of laser 130c is provided with a nitride layer 170 which is etched or masked to form the annulus region 172. the metalization layer 174 is then vapor deposited and provides a mirror $R_2$ at the interface of the nitride island 156.

Carrier confinement is provided by the diffused regions 134 and 158 as is the case of laser 130a. Further, the circular channel 168 provides a slight difference in the effective index of refraction in layer 166 directly above the channel 168. This is due to the difference in layer thickness as well as possibly due to differences in the molecular deposition of materials during growth, particularly if growth is by LPE. This slight refractive index difference will aid in optical confinement to the cavity 150.

Figure 12:
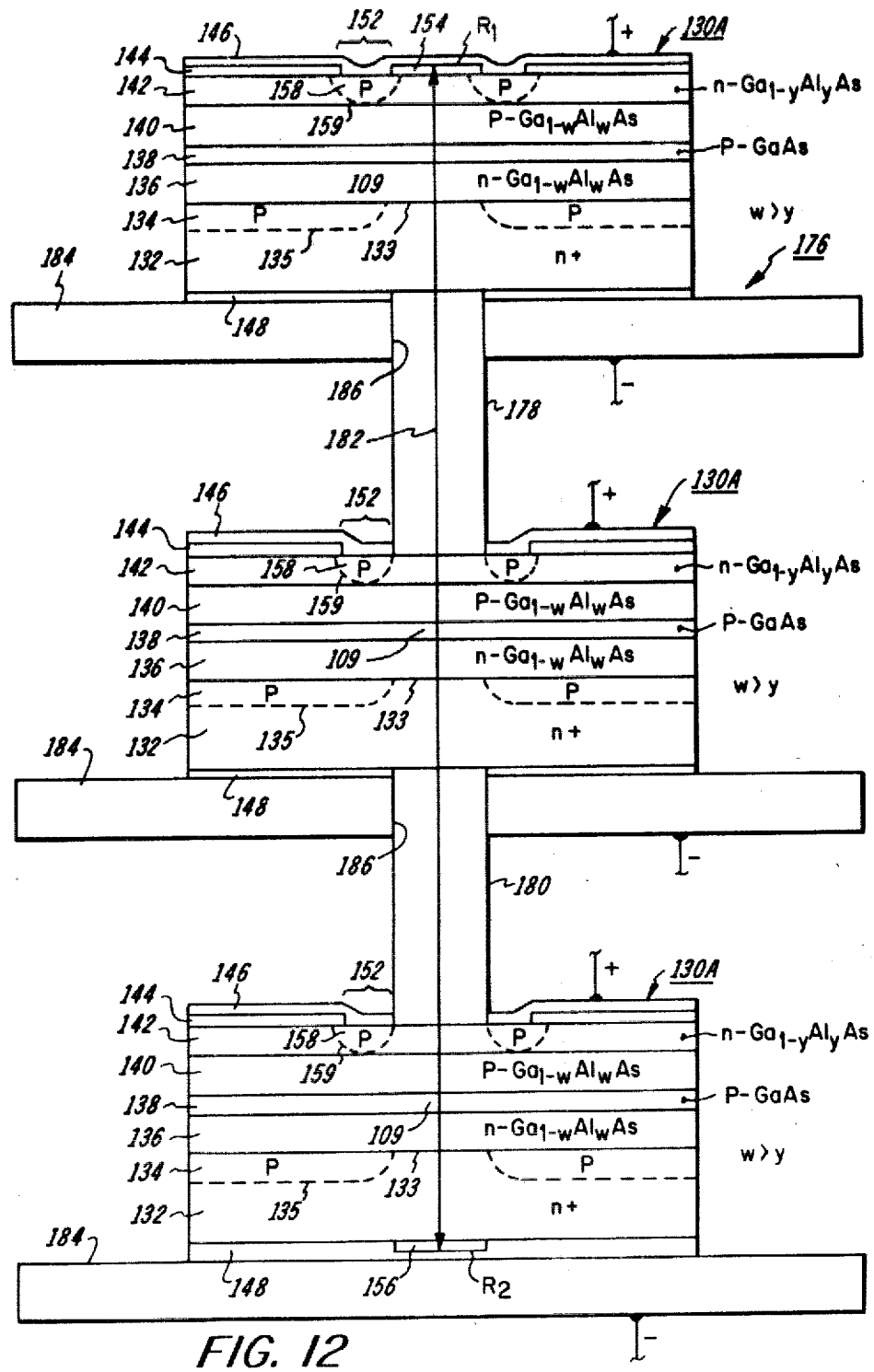
FIG. 12 is multiple laser configuration of the laser shown in FIG. 9.

FIG. 12 comprises a stacked laser structure 176 which comprises three lasers 130a optically coupled together by means of optical fibers 178 and 180. The optical cavity 182 spands the height of each of the lasers 130a and the length of fibers 178 and 180. The mirrors $R_1$ and $R_2$ are only provided at the respective ends of the cavity 182. Each of the lasers 130a is provided at its base with a metal header 184 which acts as a heat sink and is a supporting structure for the laser as well as means for electrical lead connection for current pumping. The headers 184 also provides a support for one end of the optical fibers 178 and 180. The ends of the optical fibers 178 and 180 are secured to the upper surfaces of the lasers 130a and in the openings 186 of the headers 184 with epoxy.

The cascading of the lasers 130a using optical fibers 178 and 180 has the advantage of providing separate heat sinking of each laser while enhancing the overall gain and providing a composite laser device having higher optical output power. High optical coupling efficiencies can be achieved because of the symmetry and reduced divergence of the propagating light confined to the optical cavity 182.

Figure 13:
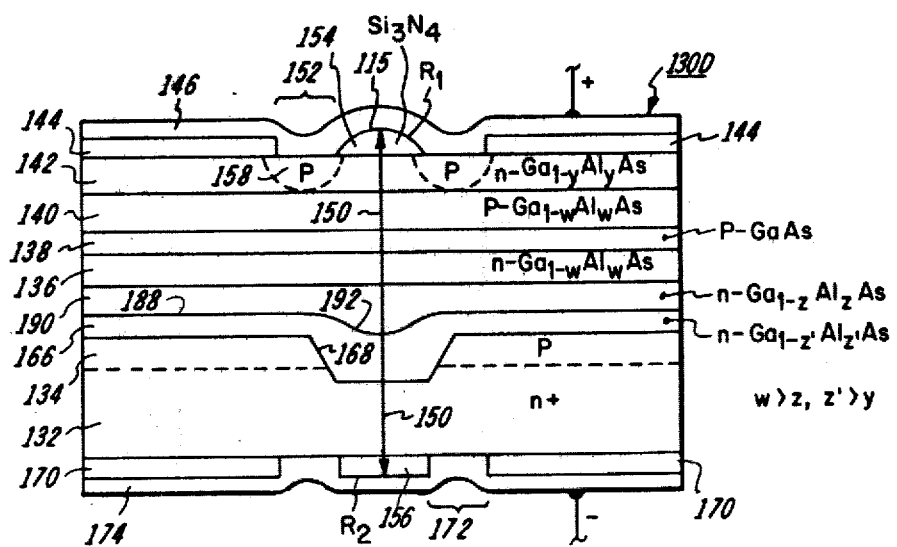
FIG. 13 is a side view of a laser comprising this invention similar to that of FIG. 12 but employing a special internal lens in the Fabry-Perot cavity and different upper mirror structure.

Laser 130d, in FIG. 13, is quite similar in structure to laser 130c in FIG. 11 except that, during sequential growth of the laser structure and after depositing the n-Ga$_{1-z'}$Al$_{z'}$As, a layer 190 comprising n-Ga$_{1-z}$Al$_z$As is grown on the oxide layer 166. Layer 166 provides good optical coupling between the substrate 132 and the layer 190. The values of z and z' are varied relative to each other to provide a desired lens effect.

By employing LPE or MOCVD, a lens shaped contour 192 can be formed during the growth of layers 166 and 190 due to the presence of the circular channel 168. The shape of the contour 192 is such that it provides an internal focusing effect on the light propagating in cavity 150. This internal focusing effect is similar to the external focusing effect of the curved mirrors 115 shown in FIG. 8. Mirror R$_1$ is formed to have a focusing effect and comprises Si$_3$N$_4$ with a curved surface 115.

Figure 14:
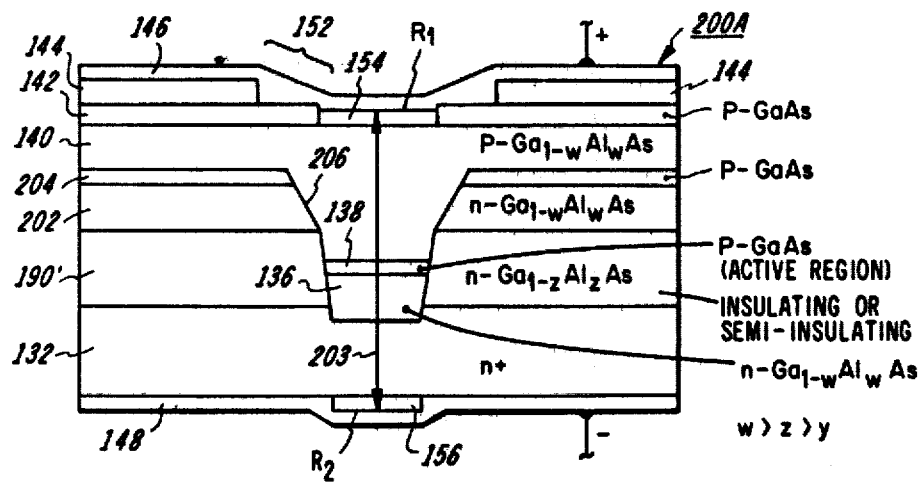
FIG. 14 is a side view of a laser comprising this invention having a buried active region to achieve current confinement.

The carrier confinement for the lasers of FIGS. 14–7 is produced by structuring laser fabrication with a buried active region surrounded by barrier means of wider bandgap. A two stage growth technique is employed. A buried active region has been provided in conventional lasers where light propagation occurs in the plane of the active layer. This buried heterostructure concept has not been applied in a transverse emitting laser in order to provide carrier and optical confinement and to provide gain sufficient for lasing.

Laser 200a in FIG. 14 comprises substrate 132 of either n+-GaAs or n+-GaAlAs upon which is sequentially grown Ga$_{1-z}$Al$_z$As (semi-insulating) layer 190', n-Ga$_{1-w}$Al$_w$As layer 202 followed by a p-GaAs capping layer 204. Layer 190' is made semi-insulating or insulating by using oxygen or chromium as a dopant or by being undoped with high resistivity.

Capping layer 204 performs three functions. First, it functions to protect the first stage growth during surface cleaning prior to etching a circular channel 206. HCL is used to clean the surface and will not attach the GaAs layer 204. Secondly, it facilitates etching of channel 206 and subsequent second stage growth.

Third, the GaAs layer 204 will help in guiding the light wave during its propagation in cavity 203. The GaAs of layer 204 will appear lossy to the propagating wave in the center of cavity 203 which aids in suppressing higher order modes.

Next, a circular channel 206 is etched into the grown layers with the etching action reaching the substrate 132. A mask having a circular opening corresponding to the circular extent of the channel 206 is employed and an etchant is applied through the mask opening. A second growth is initiated for sequential deposition of layers 136, 138, 140, and 42, as identified in previous embodiments, together with preparation of the nitride layers 144 and nitride islands 154 and 156 with metalization layers 146 and 148 providing mirrors R$_1$ and R$_2$. The sequentially grown layer 136, active layer 138, layer 140 and layer 142 are, respectively, n-Ga$_{1-w}$Al$_w$As, p-GaAs, p-Ga$_{1-w}$Al$_w$As and p-GaAs, where w is greater than z which is greater than y.

The advantage of laser 200a is that the active layer 138 is buried in higher bandgap material comprising the layer 190'. Also layer 190' surrounding the active layer or region 138 is insulative or at least sufficiently insulating to confine the current to the channel 206 and through the active layer 138. This structure also provides for carrier and optical confinement within the confines of the channel 206 forming the optical cavity 203.

Figure 15:
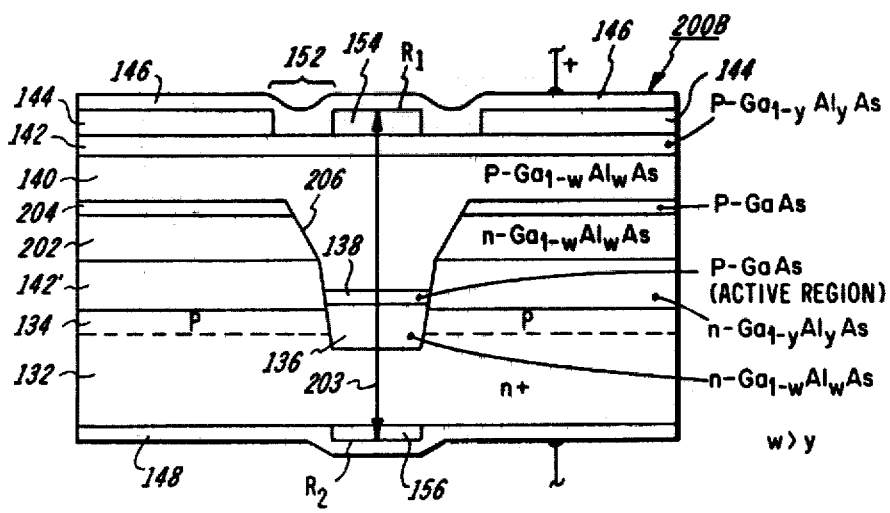
FIG. 15 is a side view of a laser comprising this invention similar to that of FIG. 14 but employing additional current confinement means in the laser substrate.

Laser 200b in FIG. 15 is fabricated in a manner similar to laser 200a except that the insulating layer 190' is not employed. Instead, the substrate 132 of n+GaAs or GaAlAs is first provided with a zinc diffusion on its surface forming the p-type region 134. Next layer 142', comprising n-Ga$_{1-y}$Al$_y$As, is grown on the substrate 132, followed by sequential growth of n-Ga$_{1-w}$Al$_w$As layer 202 and capping layer 204 of p-GaAs. After etching the circular channel 206, layer 136, layer 138, layer 140 and layer 142 are sequentially grown, followed by the formation of the nitride layers 144 and nitride islands 154 and 156 and metalization layers 146 and 148.

The advantage of laser 200b is that the layers 136 and 140 comlower bandgap materials than layer 142' so that, together with diffused regions 134, these layers provide sufficient current carrier and optical confinement for the propagating light wave in the cavity 203.

In each of these embodiments of FIGS. 14–17, further current confinement may be provided by doping layer 142 with Sn, Te or Si to provide n-type conductivity and providing an annulus type diffused region 158, as previously explained with respect to the diffused regions 158 in the embodiments shown in FIGS. 9, 11 and 13. Also, the nitride island 154 may be formed in an opening provided in the capping layer 142, as shown in FIG. 14, by performing a previous selective etch in the layer 142 followed by the selective deposition of the nitride island 154.

Figure 16:
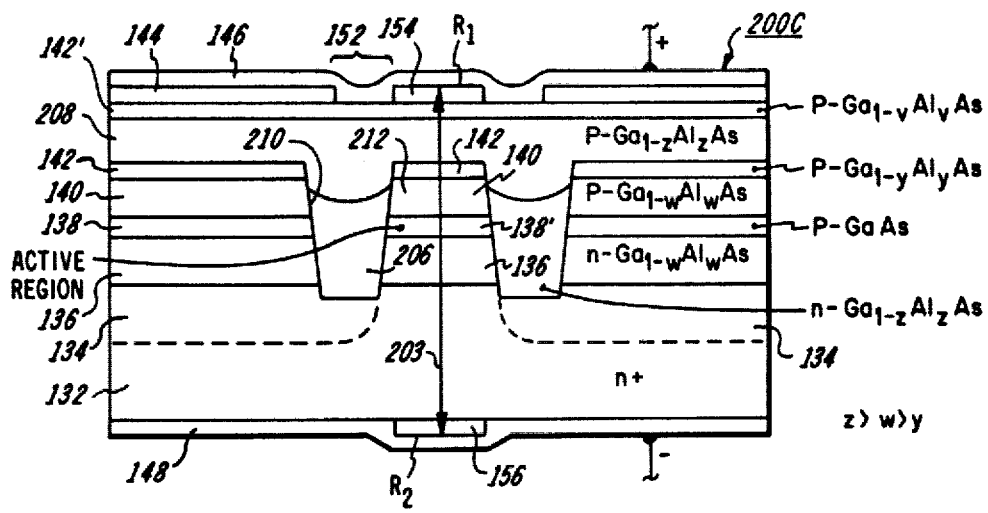
FIG. 16 is a side view of a laser comprising this invention with a mesa formed active region to achieve current confinement and reduced lateral carrier diffusion.

In FIG. 16, the first stage of growth of laser 200 is identical to the layered growth of the laser 130a. A Si$_3$N$_4$ diffusion mask having a circular pattern is applied to the substrate surface and selective Zn diffusion is performed, forming the p-type diffused region 134. With removal of the mask, layers 136, 138, 140 and 142 are sequentially grown on substrate 132. An annulus shaped channel 210 is etched into the first stage growth, the etchant penetrating the substrate 132, forming the circular mesa 212. The second stage growth process is initiated and comprises confinement layer 206 of n-Ga$_{1-z}$Al$_z$As and confinement layer 208 of p-Ga$_{1-z}$Al$_z$As followed by another p-Ga$_{1-y}$Al$_y$As layer 142' for contact connection with metalization layer 146. Note that z is greater than w, which is greater than y, in this embodiment so that lateral carrier and optical confinement is restricted through mesa 212 and the centrally formed active region 138'.

Figure 17:
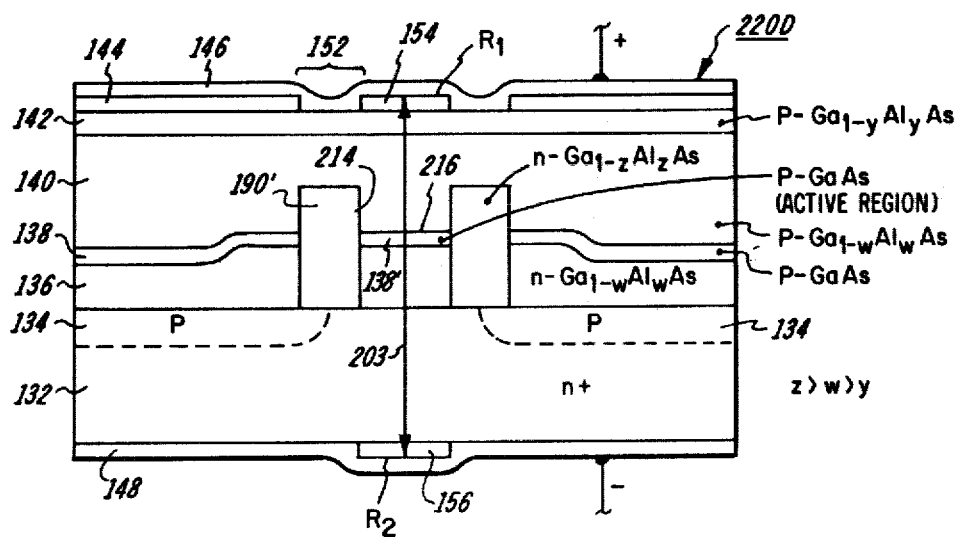
FIG. 17 is still another side view of a laser comprising this invention with a barrier-confined active region to achieve current confinement and reduce lateral carrier diffusion.

Laser 200d in FIG. 17 comprises a two stage growth device on a n-GaAs or GaAlAs substrate. A Si$_3$N$_4$ diffusion mask having a circular pattern is applied to substrate surface and selective zinc diffusion is performed, forming the p type diffusion region 134. With removal of the mask, a relatively thick layer 190' is grown to the height shown over the entire surface of the substrate 132. Layer 190' may be high resistive material. Layer 190' is then masked and etched to form the donut or annulus shaped mesa 214 of layer 190' material. The second stage growth comprises layers 136, 138, 140 and 142 as previously explained in connection with laser 130b of FIG. 10.

The advantage of laser 200d is that the annulus shaped mesa 214 provides a physical barrier for the centrally formed active region 138' so that, with z greater than w, carrier and optical confinement is restricted to the cylindrical region 216 in the confines of mesa 214. Also, current is confined through the region 216.

Figure 18:
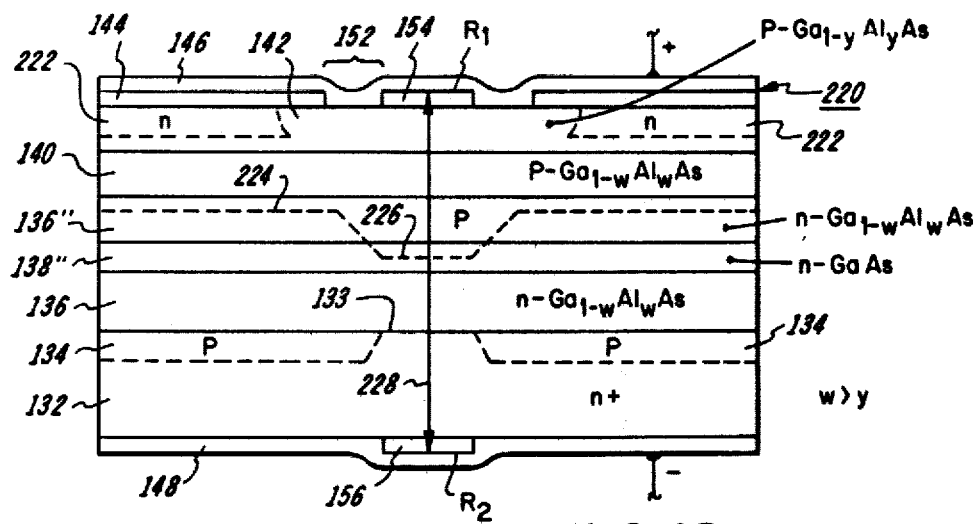
FIG. 18 is a side view of a laser comprising this invention wherein current confinement is achieved by selective diffusion.

The laser 200 in FIG. 18 provides additional carrier confinement by an additional p-type diffused active region 226.

The substrate 132 is formed with the diffused p-type region 134, as previously explained. Then, n-Ga$_{1-w}$Al- $_w$As layer 136, n-type GaAs layer 138" (active layer) and n-Ga$_{1-w}$Al$_w$As layer 136" are epitaxially grown. A selective zinc diffusion is then performed to form the p-n junction 224 and create a p-type active region 226 in active layer 138". Then, p-type layers 140 and 142 are sequentially grown followed by a selective Ge diffusion in p-type layer 144 forming an annulus n-type region 222. The device is completed with the annulus shaped current confining stripe 152 applied via the nitride and metalization steps, as previously explained.

The diffused regions 134 and 222 together with the indented shaped p-n junction 224 provided for current confinement to the active region 226 as well as a higher current density in the active region 226 of layer 138". The mirrors $R_1$ and $R_2$ provide optical feedback for light wave propagation in cavity 228.

Figure 19:
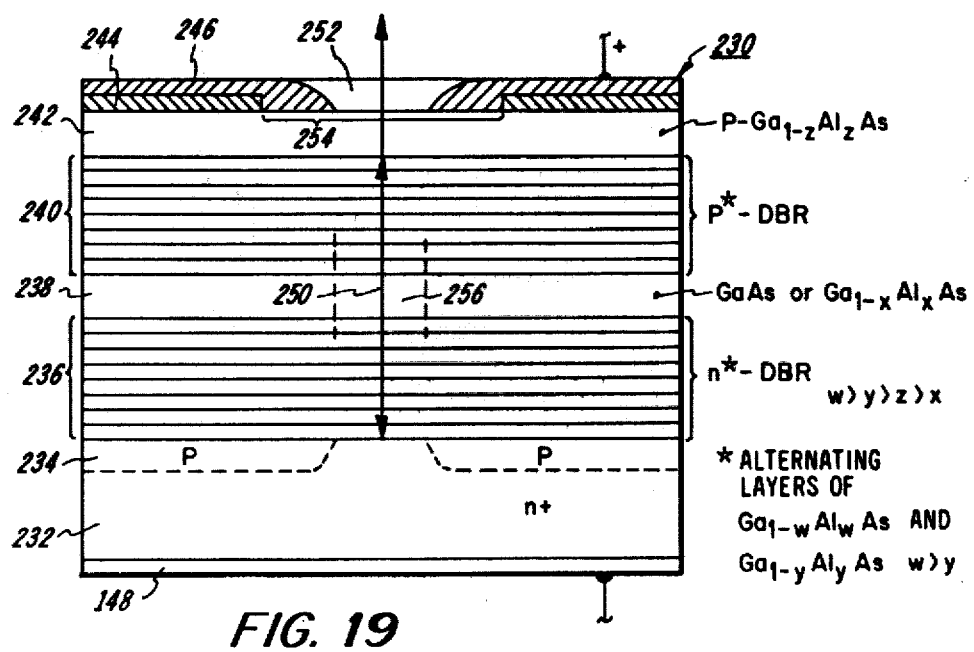
FIG. 19 is a side view of a laser comprising this invention employing DBR components to provide lasing with current confinement structure provided in the laser substrate.

Basically, laser 230 of FIG. 19 differs from previous transverse laser embodiments in the employment of two DBRs 236 and 240 in lieu of the mirrors $R_1$ and $R_2$. Laser 230 is fabricated by first providing the p-type diffusion region 234 in the surface of a n-GaAs substrate 232. This diffusion can be performed in the same manner as diffusion region 134 in previous embodiment shown in FIGS. 9, 10, 12, 17, or 18. Then, alternating layers of n-Ga$_{1-w}$Al$_w$As and n-Ga$_{1-y}$Al$_y$As, with w greater than y, are sequentially grown, forming the DBR 236. This is followed by deposition of an active layer 238, which may be p or n or undoped GaAs or Ga$_{1-x}$Al$_x$As, wherein w is greater than y, which is greater than z, which is greater than x. Then alternating layers of p-Ga$_{1-w}$Al$_w$As and p-Ga$_{1-y}$Al$_y$As are sequentially grown, forming the DBR 240. This is followed by the growth of a p-Ga$_{1-z}$Al$_z$As layer 242 providing good electrical contact for the subsequently deposited metalization layer 246. For current confinement, an annulus type silicon nitride layer 244 is deposited via selective masking, followed by the deposition of metalization layers 246 and 248. The central area 252 is masked during metalization so that light will be emitted from the surface of the layer 242. Otherwise, the metalization of area 252 would block the light unless the metalization material employed is transparent to the light, such as, tin oxide. Also, an antireflecting coating may be applied to the surface of layer 242 in the area 252.

Forward biasing of the laser 230 creates carrier recombination in the relatively thick active region 256. With light reflected from DBRs 236 and 240, light reflection and light propagation is provided in the optical cavity 250.

Layer 242 may be deposited with a n-type dopant after which a selective p-type diffusion can then be performed and would extend from the diametrical extent 254 of area 252 down to the surface of the DBR 240. This p-type diffusion would provide additional current confinement relative to the optical cavity 250.

As mentioned in the case of laser 100" in FIG. 6b, the thickness of the alternating layers of the DBRs 236 and 240 depends on the wavelength of the lasing light. The thickness of each layer in these DBRs should be ¼ wavelength or ¾ wavelength of lightwave wavelength. For the free space wavelength of light emitted from these types of lasers, this thickness may vary from 1000 Å to 3000 Å.

Figure 20:
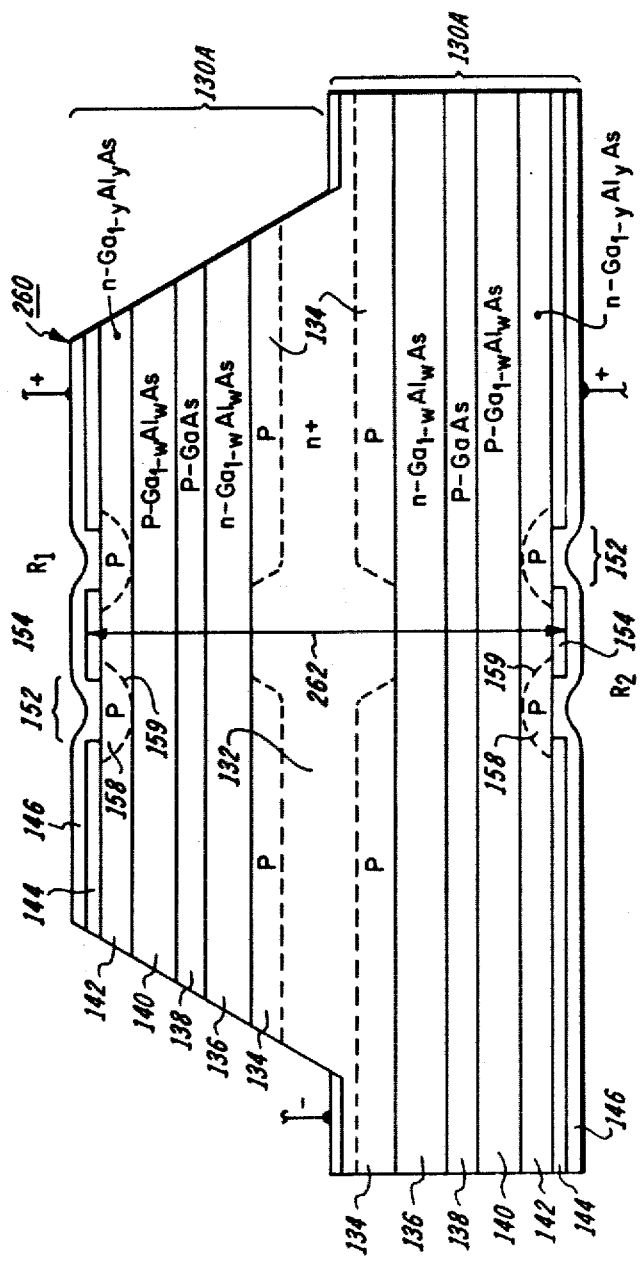
FIG. 20 is a side view of a laser comprising this invention having a pair of active regions in a single Farby-Perot cavity to achieve double gain.

Another manner of increasing the gain of a transverse light emitting laser is to fabricate two lasers back to back on a common substrate. In FIG. 20, the back to back laser 260 is provided with a completely internally formed optical cavity 262. In essence, the laser 260 comprises two integral lasers 130a back to back on a common substrate 132, the dividing point being the annulus metalization layer 264 to which the negative terminal is common to both of the back to back lasers 130a. The preferred epitaxial growth process for the laser 260 is MOCVD. Even growth and layer formation would be best achieved in a MOCVD reactor with simultaneous growth on both sides of a single substrate 132.

Figure 21:
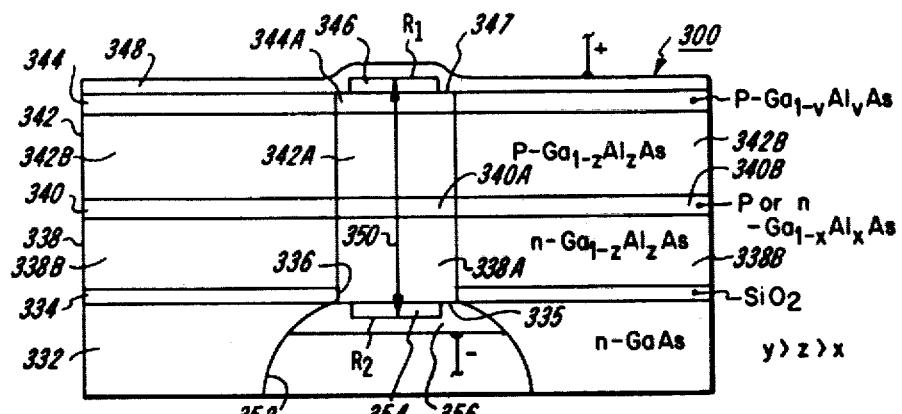
FIG. 21 is a side elevation of a laser comprising this invention having compositional differences relative to the Farby-Perot cavity and surrounding structure to provide for current confinement and reduced carrier diffusion.
Figure 22:
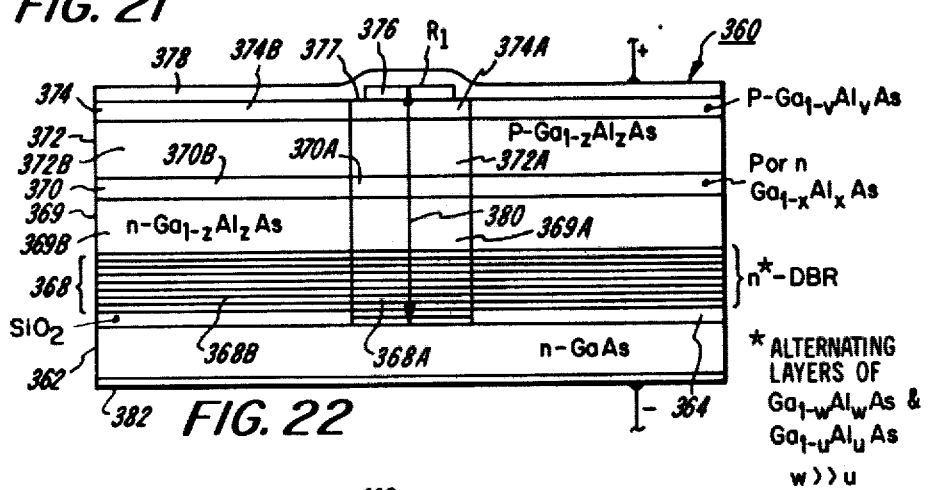
FIG. 22 is a side elevation of a laser comprising this invention similar to that shown in FIG. 21 but including a DBR component.
Figure 23:
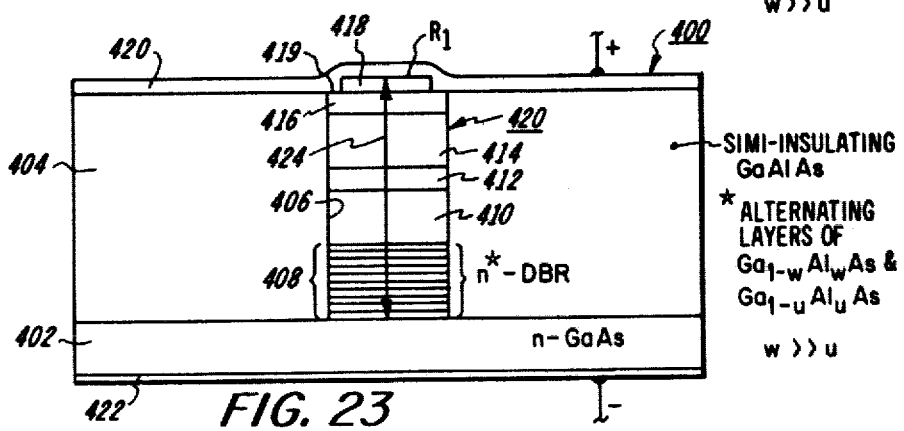
FIG. 23 is a side elevation of a laser comprising this invention similar to that shown in FIG. 22 but employing two stage growth techniques.

The lasers disclosed in FIGS. 21, 22 and 23 are embodiments based on structural suggestions made relative to laser 100' and 100" of FIGS. 6a and 6b, respectively. The main difference is that the fabrication of the optical cavity is made more current confining by employing an insulating GaAlAs material outside the Fabry-Perot cavity. This surrounding insulating material provides barrier means for carrier confinement, optical confinement and current confinement. The preferred growth technique is MOCVD.

In FIG. 21, the transverse light emissive laser 300 is fabricated by first depositing a silicon dioxide layer 334 on n-GaAs substrate 332. Then, by employing a silicon nitride mask with a central aperture, a circular opening 336 is etched in the silicon dioxide layer 334 to the surface of or slightly into the surface of the substrate 332. This is followed by semiconductor layer growth, MOCVD processing being preferred.

Crystal growth initiated on silicon dioxide will be polycrystalline while crystal growth initiated on the single crystal n-GaAs substrate in opening 336 will be single crystal growth. Continuous deposition of layer 338, therefore, results in a polycrystalline n-Ga$_{1-z}$Al$_z$As portion 338b on the silicon dioxide layer 334 and a single crystal n-Ga$_{1-z}$Al$_z$As portion 338a on the n-GaAs substrate 332. This followed by the growth of an active layer 340 having a polycrystalline portion 340b and a central single crystal portion 340a of p or n-Ga$_{1-x}$Al$_x$As. Next, layer 342 is deposited having a polycrystalline portion 342b and a single crystal portion 342a of p-Ga$_{1-z}$Al$_z$As. Finally, a capping layer 344 is deposited and consists of a polycrystalline portion 344b and a single crystal portion 344a of p-Ga$_{1-y}$Al$_y$As.

Due to the presence of the initially silicon dioxide layer 334, the materials grown on the surface of this layer will consecutively possess a polycrystalline structure. These same materials grown on the single crystal substrate will have single crystal structure. The polycrystalline structure formed by portions 338b, 340b, 342b and 344b will be semi-insulating in character.

By conventional masking, a circular silicon nitride island 346 is formed on the single crystal portion 344a, the diametrical extent of which is smaller than the diametrical extent of the portion 344a, as illustrated in FIG. 21. This forms an annular current channel 347 for current flow into the structure.

Metalization layer 348 is then deposited on layer 344 and nitride island 346. The metalization on nitride island 346 forms mirror $R_1$.

In order to form a Fabry-Perot cavity 350, an opening 352 is etched through substrate 332 to the bottom surface of single crystal portion 338a. Then circular nitride island 354 is deposited on portion 338a, the diametrical extent of which is smaller than the diametrical extent of portion 338a. This provides an annular current channel 355. Finally, a deposit of metallization 356 is made in the bottom of opening 352 forming mirror $R_2$.

Laser 300 will have very good carrier confinement properties since the outer layer portions 338b, 340b, 342b and 344b are semi-insulating compared to their corresponding central portions 338a, 340a, 342a and 344a. As a result, current and optical confinement is maintained within the central circular confines of layer portions 338a, 340a, 342a and 344a.

In FIG. 22, laser 360 is similar to the fabrication and structure of laser 300 except a DBR 368 is employed as one of the mirrors for the laser. The employment of the DBR 368 eliminates the necessity of etching into the substrate to form a second mirror structure.

A silicon dioxide layer 364 is initially deposited on the single crystal n-GaAs substrate 362. Then, a central circular opening 366 is etched into the layer 364 to the surface of the substrate 362. Alternate layers 368 of n-Ga$_{1-w}$Al$_w$As and n-Ga$_{1-u}$Al$_u$As are grown on the silicon dioxide prepared substrate. Those portions 368b of layers 368 grown or deposited on the silicon dioxide layer 364 will be polycrystalline while those portions 368a grown or deposited over the opening 366 will be single crystal.

The same is true with regard to the consecutively grown layers 369, 370, 372 and 374. Portions 369b, 370b, 372b and 374b will be polycrystalline while portions 369a, 370a, 372a and 374a will be single crystal.

Circular nitride 376 and metalization layer 378 are formed in the same manner as explained relative to the laser 300, forming an annular current channel 377 and a mirror R$_1$. Also, a metalization layer 382 is deposited on the bottom of substrate 362. The alternate layer portions 368a form a DBR to perform as a reflector.

Carrier and optical confinement are maintained within layer portions 368a, 369a, 372a, and 374a, forming an optical Fabry-Perot cavity 380, due to the semi-insulating properties of portions 368b, 369b, 370b, 372b and 374b.

The fabrication process best suited for laser 360 is MOCVD, processing as this particular process is best suited for depositing the thin layers comprising the DBR 368.

Laser 400 in FIG. 23 is essentially the same structure as the laser 360 of FIG. 22 except that the manner of fabrication is different and the layers are not continuous laterally through the device.

The laser 400 comprises an initial stage of growth of a semi-insulating thick layer 404 of GaAlAs on substrate 402. Oxygen doping will render layer 404 semi-insulating. This growth may be provided by LPE or MBE. After growth of layer 404, an elongated cylindrical like opening 406 is etched to the substrate 402. A second stage of growth comprises a plurality of layers within the cylindrical opening 406. This second stage growth is best suited for either MBE or MOCVD. In the case of MOCVD processing, a mask is provided on the surface of layer 404 and an aperture in the center of the mask exposes the opening 406 for deposition of the various layers.

The second stage growth is initiated in opening 406 with alternating layers of n-Ga$_{1-w}$Al$_w$As and n-Ga$_{1-u}$Al$_u$As, where w is greater than u, forming a DBR 408. Sequentially, a layer 410 of n-Ga$_{1-z}$Al$_z$As, a layer 412 of p or n-Ga$_{1-x}$Al$_x$As (active layer), a layer 414 of p-Ga$_{1-z}$Al$_z$As and a capping layer 416 of p-Ga$_{1-y}$Al$_y$As are deposited within opening 406.

Upon completion of this second stage growth, a circular silicon nitride 418 is deposited on and within the confines of layer 416, the diametrical extent thereof being smaller than the diametrical extent of layer 416. This forms an annular current channel 419. As a last step, metalization layers 420 and 422 are deposited on laser 400 for electrical contact connection and establishment of mirror R$_1$. The DBR 408 and mirror R$_1$ provide feedback for light propagation in optical cavity 424. Very good carrier and optical confinement is obtained due to the semi-insulating nature of layer 404.

An interesting aspect of the lasers 360 and 400 of FIGS. 22 and 23 is that the employment of the DBR as a reflector in the bottom of the optical cavities 380 and 424 permits employment of conventional GaAs substrates, which, as mentioned previously relative to the discussion of FIG. 6, may be too lossy to the propagating light, particularly in the absence of current confinement means at or near the interface between the substrate and the adjacent contiguous layer.

The first and second fabrication stages of the laser 400 may be reversed. Layers 408, 410, 412, 414 and 416 may be sequentially grown by either MBE or MOCVD followed by a perferential etch forming a cylindrical mesa 420. With the surface of layer 416 masked, the layer 404 may be deposited by LPE or MBE.

While the invention has been described in conjunction with specific embodiments, it is evident that many alternatives, modifications and variations will be apparent to those skilled in the art in light of the foregoing description. Accordingly, it is intended to embrace all such alternatives, modifications, and variations as fall within the spirit and scope of the appended claims.

What we claim is:

1. In a transverse radiation emitting semiconductor electroluminescent device wherein optical wave propagation is in a direction transverse to the planar deposition of a plurality of contiguous semiconductor layers comprising said device, one of said layers forming an active layer and having an active region with a p-n junction thereat, means to establish a transverse optical cavity for supporting optical wave propagation under lasing conditions in a direction transverse to the planar extent of said active layer when a current is applied across said junction, the emission of radiation from said device being from at least one end surface thereof transverse to the planar extent of said layers and at one end of said transverse optical cavity, current confinement means in said device to aid in the confinement of current to said active region, said device characterized by transverse waveguide confinement means surrounding at least a portion of said transverse optical cavity and extending in a direction parallel to said cavity through and beyond the lateral boundaries of said active region, the semiconductor compositional materials comprising said waveguide confinement means having a bandgap and refractive index, respectively, wider and lower than the material comprising said active region.

2. In the transverse radiation emitting semiconductor electroluminescent device according to claim 1, reflector means at the other end of said transverse optical cavity.

3. In the transverse radiation emitting semiconductor electroluminescent device according to claim 2, said reflector means comprising a distributed Bragg reflector consisting of alternating thin layers of Ga$_{1-w}$Al$_w$As and Ga$_{1-u}$Al$_u$As wherein w > u.

4. In the transverse radiation emitting semiconductor electroluminescent device according to claim 2, said reflector means comprising a stack of alternate dielectric layers of low and high refractive index material.

5. In the transverse radiation emitting semiconductor electroluminescent device according to claim 2, said reflector means comprising a parabolic reflecting surface to cause radiation to be focused back into said transverse optical cavity.

6. In the transverse radiation emitting semiconductor electroluminescent device according to claim 1, reflector means at adjacent ends of said transverse optical cavity, and annulus shaped current confinement means surrounding at least one of said reflector means to permit current introduction directly to said transverse optical cavity.

7. In the transverse radiation emitting semiconductor electroluminescent device according to claim 6, annulus shaped current confinement means surrounding the other of said reflector means.

8. In the transverse radiation emitting semiconductor electroluminescent device according to claims 6 or 7, said reflector means being a distributed Bragg reflector.

9. In the transverse radiation emitting semiconductor electroluminescent device according to claim 8, said distributed Bragg reflectors comprise alternating thin layers of $Ga_{1-w}Al_wAs$ and $Ga_{1-u}Al_uAs$ wherein $w > u$.

10. In the transverse radiation emitting semiconductor electroluminescent device according to claim 1, reflector means at adjacent ends of said transverse optical cavity, one of said reflector means is a distributed Bragg reflector.

11. In the transverse radiation emitting semiconductor electroluminescent device according to claim 10, said distributed Bragg reflector comprises alternating thin layers of $Ga_{1-w}Al_wAs$ and $Ga_{1-u}Al_uAs$ wherein $w > u$.

12. In the transverse radiation emitting semiconductor electroluminescent device according to claim 1 wherein said semiconductor waveguide confinement means is formed by a difference in the elemental constitutents in the semiconductor materials comprising said waveguide confinement means and the semiconductor materials comprising said transverse optical cavity.

13. In the transverse radiation emitting semiconductor electroluminescent device according to claim 1 wherein said semiconductor waveguide confinement means is formed by a combination of differences in both the doping profile between and the elemental composition in the semiconductor materials comprising said waveguide confinement means and the semiconductor materials comprising said transverse optical cavity.

14. In a transverse radiation emitting semiconductor electroluminescent device wherein optical wave propagation is in a direction transverse to the planar deposition of a plurality of of a contiguous semiconductor layers comprising said device, one of said layers forming an active layer and having an active region with a p-n junction thereat, means to establish a transverse optical cavity for supporting optical wave propagation under lasing conditions in a direction transverse to the planar extent of said active layer and region when a current is applied across said junction, the emission of radiation from said device being form at least one end surface thereof transverse to the planar extent of said layers and at one end of said transverse optical cavity, said device characterized in that said transverse optical cavity extends in a direction parallel to said cavity through and beyond the lateral boundaries of said active region and is formed from different compositions of semiconductor materials than regions outside of said transverse optical cavity such that the active region and regions of said layers within said transverse optical cavity immediately adjacent to said active layer have a lower bandgap and higher index of refraction than respective regions of these layers outside of said transverse optical cavity.

15. In the transverse radiation emitting semiconductor electroluminescent device according to claim 14, reflector means at least at other end of said transverse optical cavity.

16. In the transverse radiation emitting semiconductor electroluminescent device according to claim 15, said reflector means comprising a distributed Bragg reflector consisting of alternating thin layers of $Ga_{1-w}Al_wAs$ and $Ga_{1-u}Al_uAs$ wherein $w > u$.

17. In the transverse radiation emitting semiconductor electroluminescent device according to claim 15, reflector means at adjacent ends of said transverse optical cavity, and annulus shaped current confinement means surrounding at least one of said reflector means to permit current introduction directly to said transverse optical cavity.

18. In the transverse radiation emitting semiconductor electroluminescent device according to claim 17, annulus shaped current confinement means surrounding the other of said reflector means.

19. In the transverse radiation emitting semiconductor electroluminescent device according to claims 17 or 18, said reflector means being a distributed Bragg reflector.

20. In the transverse radiation emitting semiconductor electroluminescent device according to claim 14 wherein said difference in semiconductor materials is in the molar relationship of the elemental constitutents employed in the materials for regions within said transverse optical cavity as compared to those employed for regions outside of said transverse optical cavity.

21. In the transverse radiation emitting semiconductor electroluminescent device according to claim 20 wherein at least one of said regions outside of said transverse optical cavity adjacent to said active region is comprised of semiconductor materials having semi-insulating properties.

* * * * *